United States Patent [19]

Panosh

[11] Patent Number: 5,166,620
[45] Date of Patent: Nov. 24, 1992

[54] NMR FREQUENCY LOCKING CIRCUIT

[75] Inventor: Richard L. Panosh, Lisle, Ill.

[73] Assignee: Advanced Techtronics, Inc., Oak Park, Ill.

[21] Appl. No.: 610,366

[22] Filed: Nov. 7, 1990

[51] Int. Cl.$^5$ .............................................. G01R 33/20
[52] U.S. Cl. ...................................... 324/322; 324/307
[58] Field of Search ............... 324/322, 318, 309, 307, 324/314, 313; 128/653.5, 653.4

[56] References Cited

U.S. PATENT DOCUMENTS 4,875,486 10/1989 Rapoport et al. .................. 128/653

OTHER PUBLICATIONS

"Locked NQR Spectrometer for Pressure Measurements" by R. C. Frisch, Journal of Research NBS, vol. 74C, Nos. 1 & 2, pp. 3-8 (May 18, 1970).
"Locked NQR Spectrometer" by R. J. Vorpicelli et al., The Review of Scientific Instrum., vol. 36, No. 2, Feb. 1965.

Primary Examiner—Louis Arana
Attorney, Agent, or Firm—Jones, Day, Reavis & Pogue

[57] ABSTRACT

An NMR locking mechanism for use with not only electromagnets, superconducting magnets and permanent magnets, but also with ultrahigh energy product magnets such as neodynium. The circuit utilizes a single conversion superheterodyne receiver with a phase locked loop that forms a locking mechanism that depends upon a variable frequency. The resonant frequency of the nuclei is compared to a variable excitation frequency which is adjusted to maintain a control frequency with one unique value of the control frequency being zero at lock.

28 Claims, 13 Drawing Sheets

NMR FREQUENCY LOCKING CIRCUIT

FIELD OF THE INVENTION

The present invention relates to an NMR frequency locking circuit in general and in particular to an NMR locking circuit in which the frequency locking mechanism depends upon a variable frequency. Thus, the resonant frequency of the nuclei is compared to a variable frequency excitation that is adjusted to maintain a fixed offset frequency.

BACKGROUND OF THE INVENTION

Development of nuclear magnetic resonance (NMR) spectroscopy for biological diagnostics is well known in the prior art. It is understood that techniques for NMR spectroscopy rely upon identifying characteristic concentrations and distributions of protons in a test sample, which may be in vivo as well as in vitro, by subjecting the sample to pulses of electromagnetic energy while the same is positioned within a uniform magnetic field. A typical such pulse used to analyze protons is at 50 MHz for 10 microseconds, although frequencies and pulse widths will vary. Data characteristics of the proton population received while the sample is under the influence of the magnetic field yield valuable information about living systems without the use of invasive examination techniques and methods.

In one form, the device is portable and provided with means for receiving a portion of the body of a patient and exposing the portion of the body to a first fixed or biasing magnetic field and a second pulsed field generated by an energy source. Sensors are provided for sensing the rates of relaxation or energy release, commonly called the free induction decay (FID), so as to develop a spectrum. Analytical means are coupled to the sensors for receiving and analyzing the signals emitted, discriminating between various peaks, comparing the amplitude or height of various peaks, and normalizing the analysis by reference to a standard sample so as to obtain the concentration of constituents in the tested materials.

One of the principal components of the NMR instrument is the first fixed or biasing magnet for providing the first magnetic field. In portable devices, the biasing magnet is physically much smaller than the magnets used in the standard NMR machines. Another component is a coil for applying a second pulsed field to the test sample with an energy source and for sensing the energy released therefrom or the FID. A single coil or multiple coils can be used to apply the pulsed field and sense the released energy.

Useful application of NMR spectroscopy and imaging requires the apparatus to lock to the resonant frequency of the nucleus in order to obtain high resolution. Several methods have been developed over the years which include continuous wave (CW) and pulsed techniques. However, they all monitor the resonant frequency of the nuclei and adjust the magnetic field applied to the nuclei to maintain resonance. Since the nuclear resonant frequency is linearly related to the magnetic field, changes in the nuclear resonant frequency are equal to changes in the magnetic field. Historically, the operating frequency of the spectrometer is fixed by the use of a crystal oscillator. The resonant frequency of the nuclei is then compared to the fixed frequency of the oscillator to establish a difference frequency and the magnetic field is suitably altered according to the difference frequency to maintain the set difference. Such a device provides an explicit solution of the linear equation relating the magnetic field and the resonant frequency.

Several other related frequencies are generated in the transmitter to allow the receiver to track in frequency. Generally speaking, a dual conversion superheterodyne circuit is used in the prior art with a phase detector following the IF amplifier. Before the introduction of the phase detector at this point, an envelope detector such as a diode was used in this location. The output signal at this point is the FID signal. The phase detector merely serves as a second mixer and the receiver is thus classified as a dual conversion superheterodyne. The frequency of the FID is the difference between the exciter frequency and the nuclear resonant frequency. When the FID signal is zero, the circuit is tuned to resonance and the signal is synchronously detected to generate the amplitude that is equal to the exponential decay of the magnetic component of the nuclei. At this point, the amplitude of the generated signal provides little use as a lock. Additionally, any attempt to use it as a lock would be hampered by the DC drift and level shifts of direct coupled amplifiers. To produce a lock signal, an audio offset frequency is generated in the transmitter and a second phase detector is employed to generate an error sign'1 that is used to produce corresponding required changes in the magnetic field.

Although the prior art circuits are complicated, they have been successfully employed with electromagnets, superconducting magnets and perhaps some permanent magnets in the field of NMR spectroscopy. However, their application to ultrahigh energy product magnets is not feasible. The energy product of new rare earth magnetic materials such neodynium results in such large equivalent ampere-turns that it is difficult to augment the field with an additional electromagnetic field to substantially change the field. Additionally, the high energy product materials exhibit a large temperature coefficient which requires even greater correction. The problem is also aggravated in a highly homogeneous magnetic field design where multiple flux paths are utilized. Addition of ampere-turn windings to modulate the main magnetic field will alter the relationship to the side magnets and consequently change the gradients and the spectrometer resolution.

In order to overcome these disadvantages, the preferred embodiment of the present invention utilizes a frequency locking mechanism that depends upon a variable frequency. This is also an implicit solution to the linear equation relating field and frequency. Thus, the resonant frequency of the nuclei is compared to a variable frequency excitation that is adjusted to maintain a fixed offset frequency. One unique frequency value caused by this offset frequency is zero. The novel circuit utilizes a single conversion superheterodyne receiver, is much simpler than the dual conversion superheterodyne of the prior art and is available in integrated circuit form. It uses a phase detector after the IF amplifier in the receiver. The advantage of this system, besides the extensive use of integrated circuits and the reduction of components, is the resulting wider bandwidth of the loop filter and a corresponding faster response time. A voltage controlled oscillator tracks low frequency signals below the loop filter cut-off frequency and is unable to track frequencies above this value. As a result, during lock, the VCO assumes the spectral purity and phase noise characteristics of the nuclear reference signal around $\pm F_n$, the loop filter cut-off frequency, and thus regenerates the resonant frequency. This regenerated frequency can be translated by another phase locked loop to control a second spectrometer that will also track field changes of the same magnet. Since the FID of the second spectrometer is in the low audio range below $F_n$ as required by subsequent analog to digital converters, the increased loop bandwidth is beneficial.

Thus, it is an object of the present invention to provide an NMR circuit that uses a single conversion superheterodyne circuit.

It is also an object of the present invention to provide an NMR circuit that utilizes a frequency locking mechanism that depends upon a variable frequency.

It is still another object of the present invention to provide an NMR circuit in which the resonant frequency of the nuclei is compared to a variable frequency excitation that is adjusted to maintain a fixed offset frequency.

Still another object of the present invention is to provide an NMR circuit that can be used with ultrahigh energy product magnets such as neodynium.

Another object of the present invention is to provide an NMR circuit that reduces the number of required components and makes extensive use of integrated circuits.

It is also an object of the present invention to provide an NMR circuit that results in a wider bandwidth of the loop filter and has a corresponding faster response time than is available in the prior art.

It is another object of the present invention to provide a single conversion superheterodyne receiver generating a lock signal that is filtered in a feedback loop to obtain a signal that is sufficiently reduced in frequency so that it can vary the magnetic field to maintain lock.

It is yet another object of the present invention to provide a single conversion superheterodyne receiver generating a lock signal that is passed through a wide band filter in a feedback loop to obtain a frequency that is sufficiently high to reduce the phase noise of a voltage controlled oscillator and give greater accuracy in locking to the resonant frequency by causing the frequency of the voltage controlled oscillator to take on the high frequency characteristics of the nuclei signal frequency.

SUMMARY OF THE INVENTION

Thus, the present invention relates to a device for use in NMR spectroscopy for locking to the resonant frequency of the nuclei in a sample. It comprises means for applying a fixed magnetic field to the nuclei, means including a local oscillator for exciting the nuclei with a variable frequency signal to cause a resonant frequency to be generated by the nuclei, means coupled to the nuclei for comparing the generated resonant frequency signal with the local oscillator signal to obtain a variable control frequency, and a feedback loop coupled to the comparing means for utilizing the variable control frequency to adjust the local oscillator frequency and vary the nuclei excitation frequency with a change in the resonant frequency of the nuclei.

The invention also relates to a method for locking to the resonant frequency of the nuclei in a sample with a device for use in NMR spectroscopy comprising the steps of applying a fixed magnetic field to the nuclei, exciting the nuclei with a variable frequency signal, including a local oscillator frequency, to cause a resonant frequency to be generated by the nuclei, comparing the generated resonant frequency signal with the local oscillator signal to obtain a variable control frequency, and coupling a feedback loop between the comparing means and the local oscillator for utilizing the variable control frequency to adjust the local oscillator frequency and vary the nuclei excitation frequency with a change in the resonant frequency of the nuclei.

BRIEF DESCRIPTION OF THE DRAWINGS

These and other objects of the present invention will be more fully disclosed in the following detailed description when taken in conjunction with the drawings in which like numerals represent like components and in which.

DETAILED DESCRIPTION OF THE DRAWINGS

Figure 1:
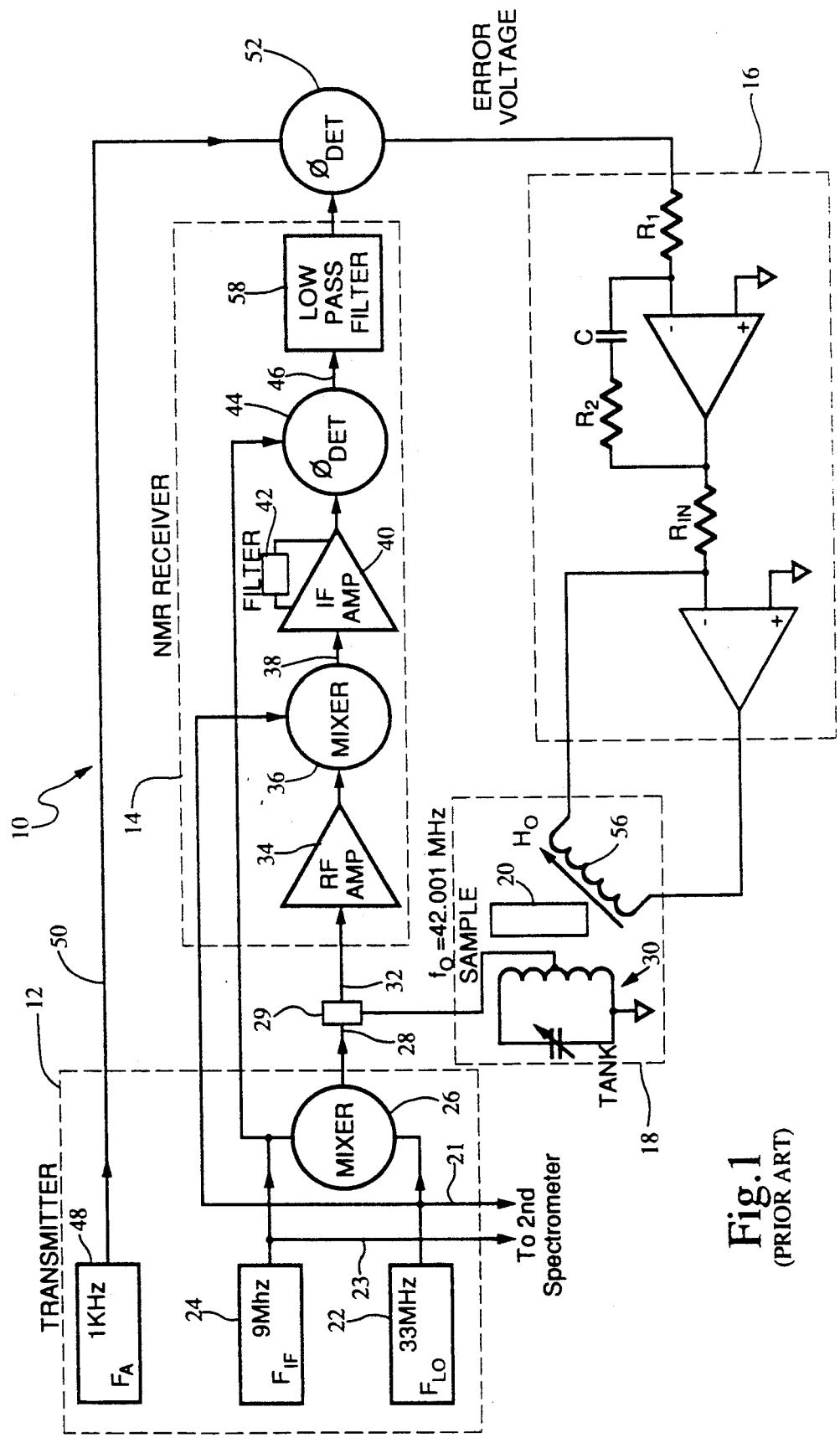
FIG. 1 is a diagram of a prior art typical circuit for obtaining a pulsed NMR lock.

It is well known in the prior art that useful application of NMR spectroscopy requires apparatus to lock to the resonant frequency of the nuclei in a sample in order to obtain high resolution results. This is accomplished by placing the sample to be analyzed in a magnetic field, exciting the nuclei with the use of a short-lived RF pulse at a given frequency, comparing the received NMR generated signals from the excited nuclei with a crystal oscillator frequency and altering the magnetic field applied to the nuclei to maintain a set difference frequency between the frequency of the NMR generated signals and the oscillator frequency. A typical prior art circuit for performing these results using pulsed techniques is shown in FIG. 1.

The NMR prior art circuit 10 includes a transmitter 12, NMR receiver 14, feedback loop 16 and excitation circuit 18. The sample 20 is placed in a fixed magnetic field generated by a source 19 well known in the art such as permanent magnets and the like. The transmitter 12 includes a local oscillator 22 and an intermediate frequency oscillator 24 that are locked together with a common oscillator as is well known in the art. The frequency of the local oscillator 22 may be, for example, 33 MHz, and the frequency, $f_{IF}$, of the intermediate frequency oscillator may be, for example, 9 MHz. These two frequencies may be coupled on lines 21 and 23 to a second spectrometer (not shown) for analyzing a specimen as is well known in the art. They are also combined in mixer 26 and coupled on line 28 to a transmit/receive switch 29 and thence to tank circuit 30 of excitation circuit 18 to provide the initial excitation of the sample nuclei. The resulting NMR signal generated by the nuclei of the sample 20 is detected by tank circuit 30 and coupled through transmit/receive switch 29 on line 32 to receiver 14. In the receiver 14, an RF amplifier 34 amplifies the NMR frequency, $f_o$, and applies it to mixer 36. Mixer 36 also receives the local oscillator frequency, $f_{lo}$, from the local oscillator 22 and generates an output on line 38 equal to $f_o - f_{lo}$. If the NMR signal, $f_o$, equals 42 MHz and the local oscillator signal is 33 MHz, for example only, the output on line 38 would be 9 MHz. This IF frequency is coupled through IF amplifier 40 and associated bandpass filter 42 to a phase detector 44. Detector 44 functions as a second mixer and mixes the intermediate frequency from IF oscillator 24 in transmitter 12 with the IF frequency from IF amplifier 40 and filter 42. The output of the phase detector 44 on line 46 is a signal known in the art as the free induction decay (FID) signal. Thus, at this point, the frequency of the FID is merely the difference between the exciter frequency $(f_{lo}+f_{IF})$ and the nuclear resonance frequency $(f_o)$. When the nuclear resonance frequency, $f_o$, equals the exciter frequency, $f_{lo}+f_{IF}$, the FID frequency is 0. This does not mean that the free induction decay is 0, but rather that the circuit is tuned to resonance and the signal is synchronously detected to generate an amplitude which is equal to the exponential decay of the magnetic component of the nuclei as is well known in the art. Thus, the signal on line 46 is utilized by the spectrometer to provide useful information regarding the sample under test.

However, the signal on line 46 provides little use for locking the spectrometer to the NMR frequency. Further, any attempt to use it as a lock would be hampered by the DC drift and level shifts of the direct coupled amplifiers in the circuit. Thus, an audio offset frequency, $f_a$, is generated in the transmitter 12 by oscillator 48 which is also frequency locked to oscillators 22 and 24 as is well known in the art. It is coupled on line 50 to a second phase detector 52 to generate an error signal on line 54 that is coupled to feedback loop 16 which converts the difference frequency to a voltage and then the voltage is converted to a current that is applied to coil 56 to generate corresponding corrections by varying the magnetic field being applied to the sample 20. Thus, a lock is obtained $f_o=42.001$ MHz as adjusted by the current in coil 56. The output of phase detector 52, at lock, is a signal represented by the equation $[(f_o-f_{lo})-f_{IF}]-f_a=0$.

Those skilled in the art will recognize the circuit of FIG. 1 as a dual conversion superheterodyne receiver. The double conversion occurs at mixers 36 and 44. The output of the signal from mixer or phase detector 44 is passed through a low pass filter 58 to phase detector 52 to produce the error voltage for the feedback loop.

Thus, the circuit is not only complex and requires a dual conversion process, but it is also feasible to use this circuit only with electromagnets, superconducting magnets and some permanent magnets. The application of this circuit to magnets formed with ultrahigh energy products is not feasible. The energy product of new rare earth magnet materials such as neodynium results in such a large magnetic field that it is difficult to augment the field with an additional electromagnetic field that will substantially change the large existing field. Additionally, the high energy product magnetic materials exhibit a large temperature coefficient which requires even greater correction. The problem is further aggravated in a highly homogeneous magnetic field design where multiple flux paths are generated utilizing shim magnets, for example. Addition of ampere-turn windings in the exciter to modulate the main magnetic field will alter the relationship to the shim magnets and consequently change the gradients and the spectrometer resolution.

Figure 2:
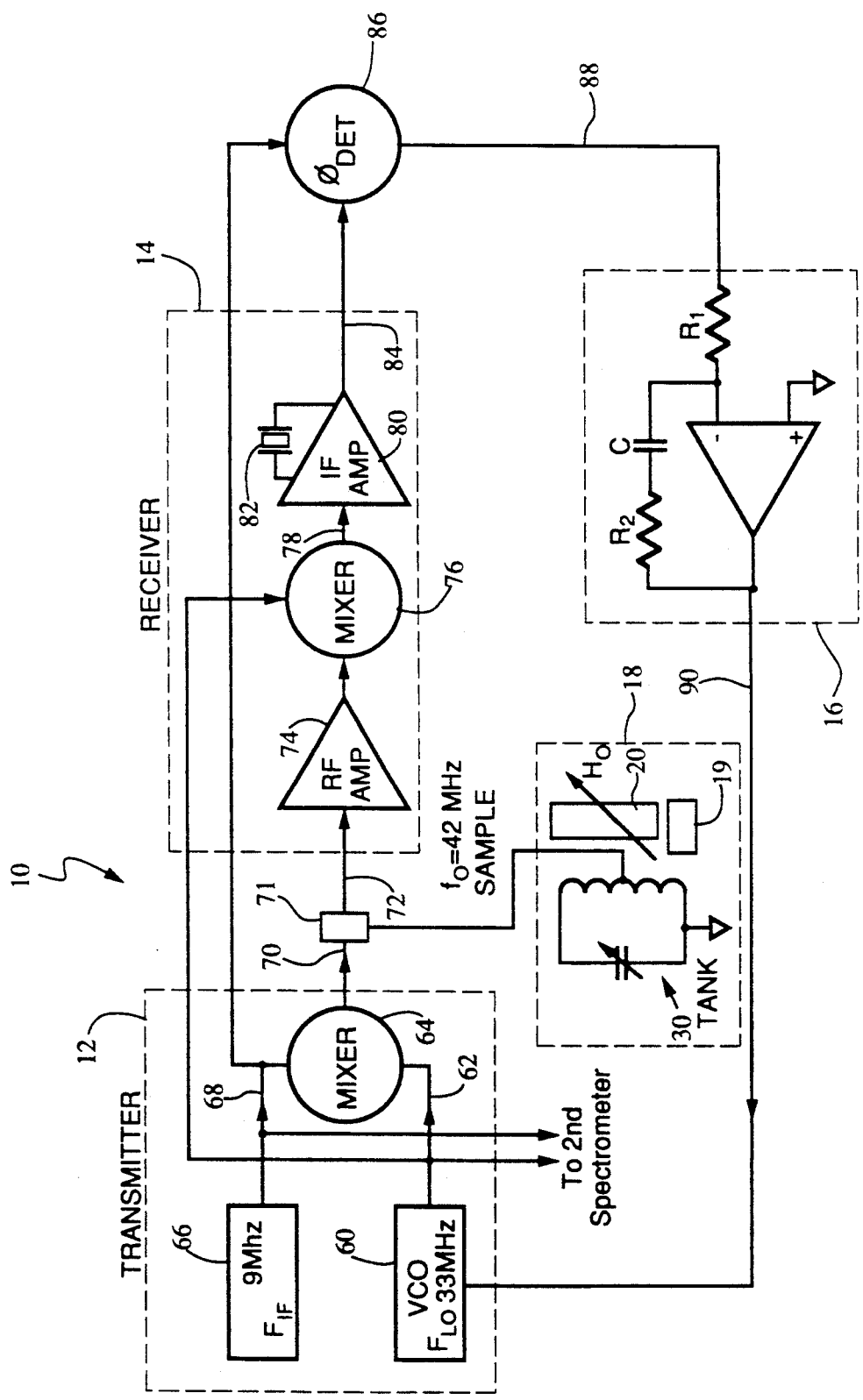
FIG. 2 is a circuit diagram of the present invention for obtaining a NMR lock with a variable frequency.

In order to avoid these problems, the present invention, illustrated in FIG. 2, is a circuit in which the frequency locking mechanism depends upon a variable frequency rather than a variable magnetic field applied to the sample. This approach is an implicit solution to the linear Larmor equation relating field and frequency as well known in the art. Thus, with the circuit of FIG. 2, the resonant frequency of the sample nuclei is compared to a variable frequency excitation which is adjusted to maintain an offset frequency which, when compared with a generated offset frequency, $f_{IF}$, produces a control signal. One unique value of this control signal or frequency is zero. Again, it will be noted that the novel circuit 10 includes a transmitter 12, receiver 14, feedback loop 16, and a excitation circuit 18. However, in this case, the receiver 14 is a single conversion superheterodyne and the feedback loop 16 uses the control signal to generate a control voltage that changes the frequency of the voltage controlled oscillator 60 in transmitter 12 instead of changing the magnetic field applied to the test sample 20. Again, the test sample 20 is subjected to a fixed magnetic field generated by one of a number of means 19 well known in the art, including magnets made of rare earth materials such as neodynium. The output of the voltage controlled oscillator 60 on line 62 is a frequency, $f_{lo}$, that may be, for example, 33 MHz, and that is coupled to a mixer 64 in transmitter 12 where the signal, $f_{lo}$, is added to an intermediate frequency, $f_{IF}$, generated by the intermediate frequency oscillator 66 that may be, for example, 9 MHz. Again, the signals on lines 62 and 68 may be coupled to a second spectrometer (not shown) for analyzing a specimen as is well known in the art. The output of the mixer on line 70, in this example, is 42 MHz and is coupled through transmit/receive switch 71 to excite the tank circuit 30 and cause the nuclei of sample 20 to generate an NMR signal, $f_o$, which, in this example, may be approximately 42 MHz. Again, this signal, $f_o$, is picked up by tank circuit 30 and coupled through transmit/receive switch 71 on line 72 to RF amplifier 74 in receiver 14. The output of the RF amplifier 74 is coupled to a mixer 76 which also receives the VCO signal, $f_{lo}$, from oscillator 60 in transmitter 12. The output of mixer 76 on line 78 is $f_o-f_{lo}$. If the NMR frequency is, for example, 42 MHz, and the VCO frequency of generator 60 is 33 MHz, a signal of 9 MHz would appear on line 78 to IF amplifier 80. IF amplifier 80 is associated with a crystal filter 82 that establishes the desired bandwidth. The output of receiver 14 on line 84 is coupled to a phase detector 86. The other input to phase detector 86 is the output, $f_{IF}$, of the intermediate frequency oscillator 66 on line 68. The output of the phase detector 86 on line 88 is $(f_o-f_{lo})-f_{IF}=0$ at lock. Thus, if the NMR frequency is 42 MHz and the local oscillator frequency is 33 MHz, the difference is 9 MHz. When that 9 MHz signal is subtracted from the intermediate frequency signal of 9 MHz from generator 66, the difference equals 0 and the system is in lock. The signal on line 88 from phase detector 86 is coupled to a phase lock loop 16 which generates an output control voltage on line 90 that is coupled back to voltage controlled oscillator 60 in transmitter 12 to adjust the VCO frequency to maintain lock. The advantages of the circuit of FIG. 2 include a single conversion receiver 14 that is available in integrated circuit form and a phase detector 86 that operates at the IF frequency. Besides the extensive use of integrated circuits and the reduction of components when compared to the prior art, this circuit has a resulting wider bandwidth because the feedback loop filters the IF frequency rather than the audio frequency as in the prior art and therefore has corresponding faster response times. The VCO can track low frequency signals below the loop filter cut-off frequency ($f_n$) and is unable to track frequencies above this value. As a result, during lock, the VCO assumes the spectral purity and phase noise characteristics of the nuclear reference signal below $\pm f_n$ and thus causes the resonant frequency to be regenerated. This regenerated frequency can be translated by another phase locked loop to control a second spectrometer that will also track field changes of the same magnet. Since the FID of the second spectrometer is in the low audio range below $f_n$, as required by subsequent A/D converters, the increased loop bandwidth is beneficial.

Figure 3:
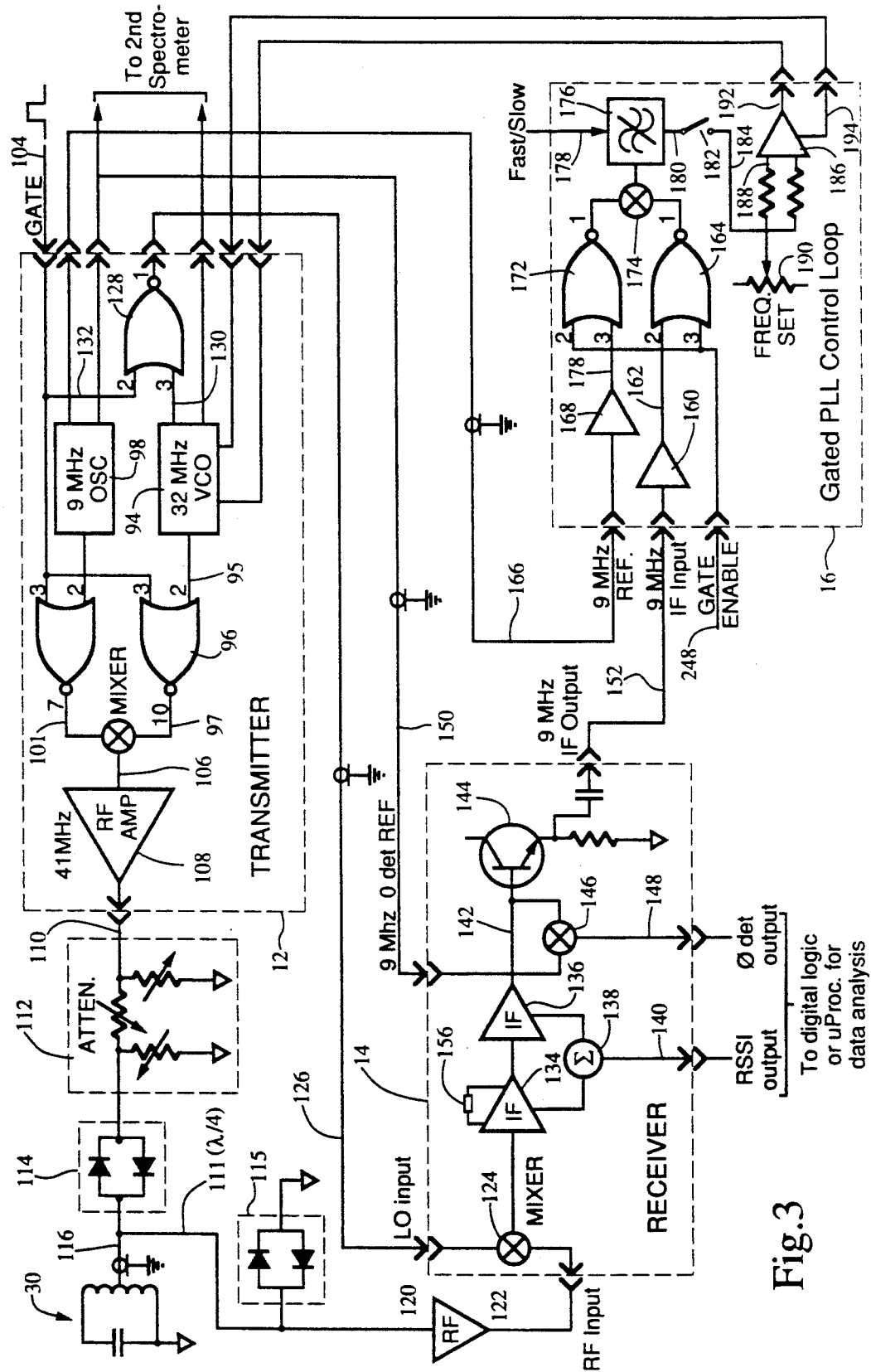
FIG. 3 is a block diagram of the NMR frequency locking circuit of the present invention.

FIG. 3 is a more detailed diagram of the NMR frequency lock circuit of FIG. 2 illustrating a lock for a 10K gauss neodynium-iron-boron permanent magnet. The temperature coefficient of the magnet is $-0.1\%/°C$. so the specific magnet will drift $-10G/°C$. where G=gauss. The resonant frequency for the proton is 42 MHz. Thus, the temperature coefficient drift is 42 KHz/°C. With the addition of a temperature control circuit, well known in the art, the internal magnet temperature can be held to 1 m°C. (where m°=millidegree) for each degree change per hour in the ambient temperature. The frequency change is then 42 Hz/m°C. Since no magnet will produce a perfect homogeneous field, they are delivered with shim coils which improve the field characteristics and generate correctional fields of known geometry. Changes in sample test tubes and in the operating current of the shim coils further aggravate the temperature problem where line widths of half-a-Hertz must be resolved repeatedly and over long periods of time to permit signal averaging. The novel lock circuit of the present invention is shown in FIG. 3. Several unique elements are combined in the design to produce a low cost spectrometer with all units employing surface mounted components and stripline circuit techniques. The surface mounting and stripline techniques reduce the effect of stray capacitance and reduce electromagnetic radiation which aids in stability and performance. All units use integrated circuits to reduce component count and cost because they are readily available as consumer items.

Figure 4A:
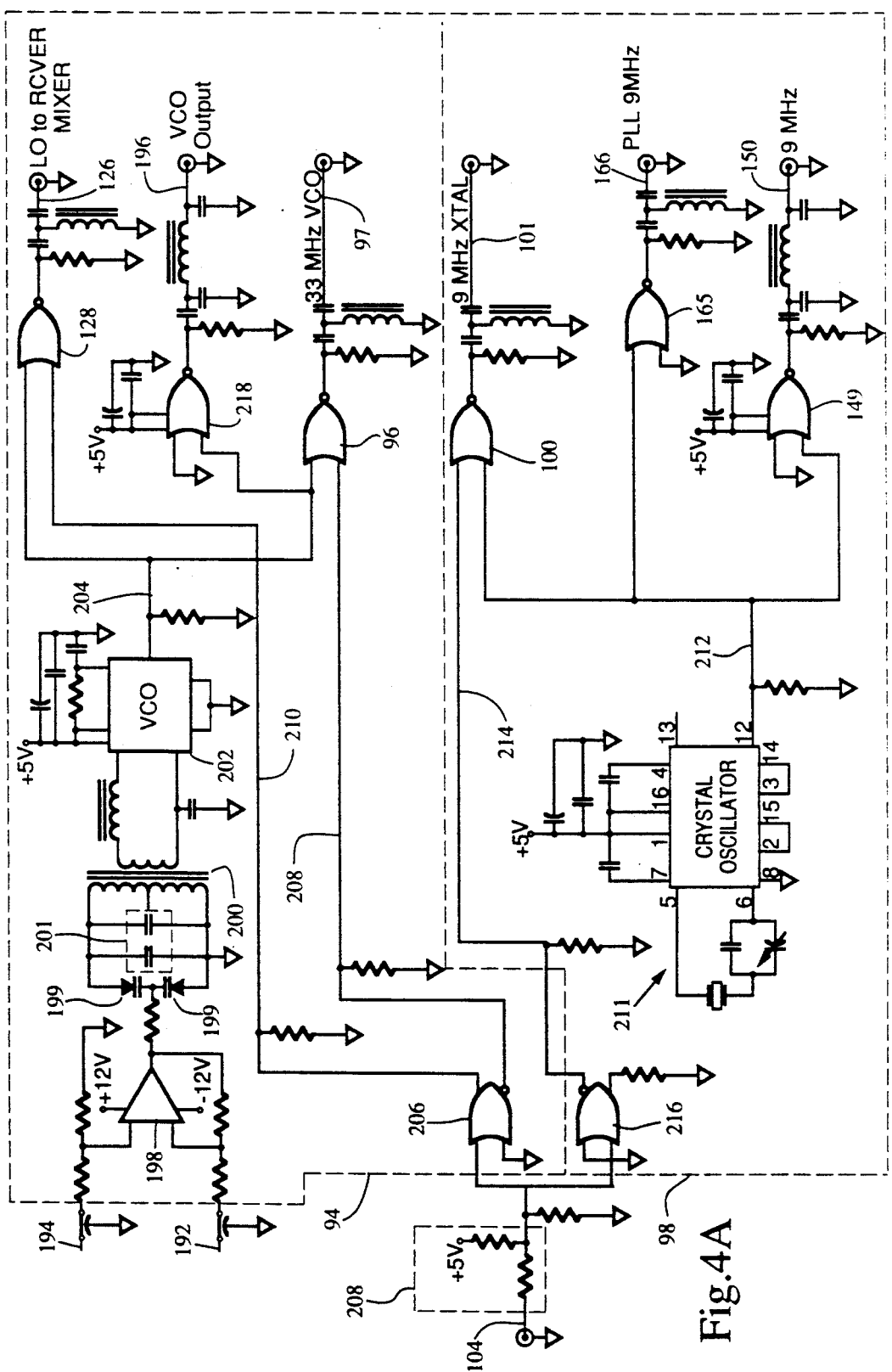
FIGS. 4A and 4B are detailed circuit diagrams of the novel transmitter illustrated in the circuit of FIG. 3.
Figure 4B:
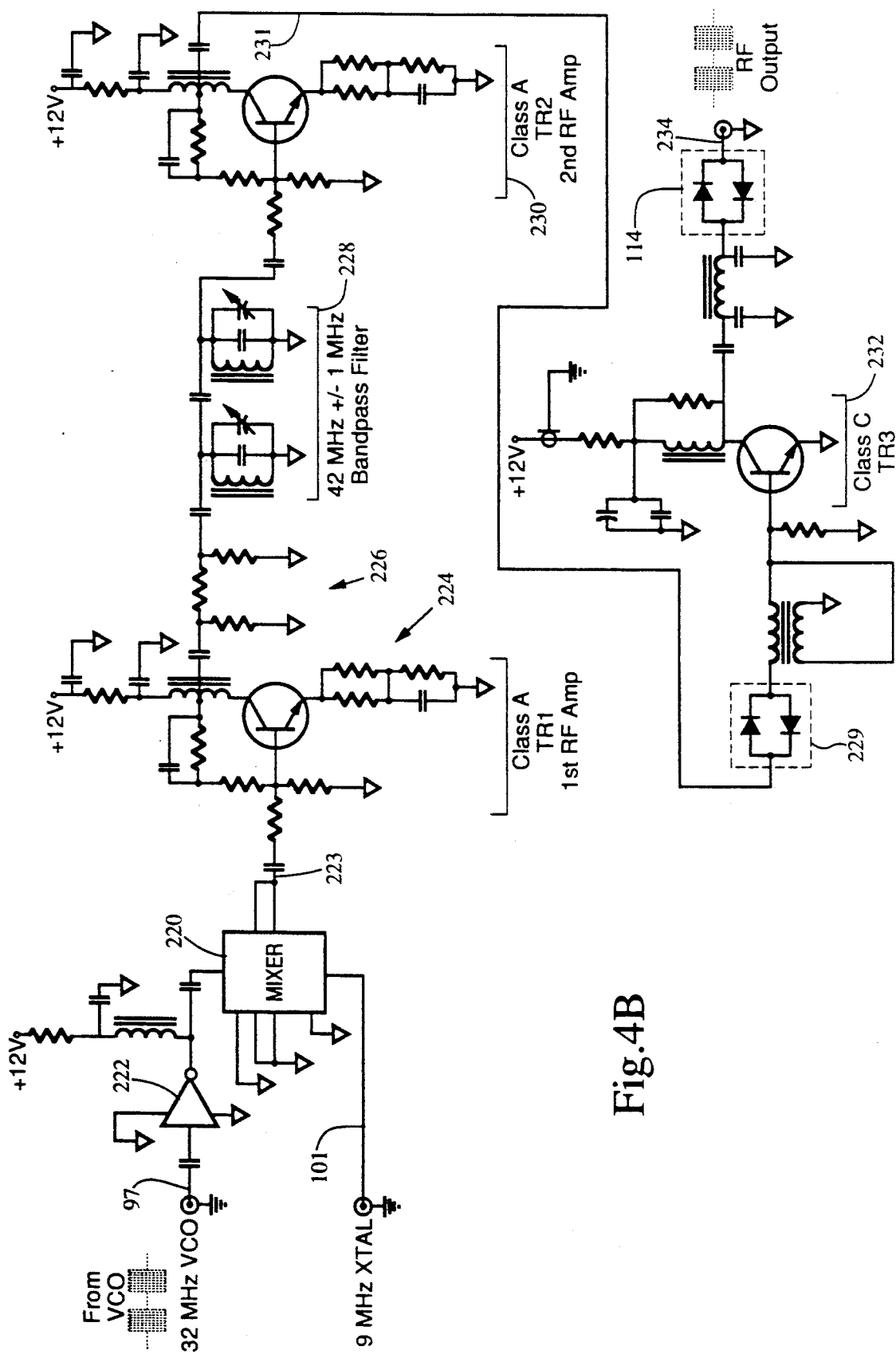

The novel transmitter 12 provides the receiver local oscillator injection frequency and the 9 MHz receiver IF frequency. No fundamental frequency at the resonant frequency of the nucleus is provided, but a control frequency is generated as required by gating the IF frequency and the local oscillator frequency. This aids in reducing signal leakage directly into the receiver when the transmitter is disabled. The design of the circuit, as will be seen hereafter, is based upon the use of ECL digital logic. ECL is used since it can directly drive a 50-ohm load at a zero-DBM level and easily interfaces to 50-ohm coaxial cables. Where several 50-ohm loads must be driven, it is a simple matter to add another ECL gate. Simple, low Q, untuned low pass and high pass filters are used with the digital wave form to pass the fundamental. The 33 MHz VCO 94 utilizes the MC1648 oscillator as shown in FIG. 4A. The oscillator tank is tapped down to prevent the oscillator from loading the tank Q. The mixer output frequencies are filtered by the only tuned circuits 228 (in FIG. 4B) in the transmitter. The output amplifier is operated Class C as shown in FIG. 4B to reduce power dissipation and requires no active gating. A passive 50-ohm attenuator 112 can be installed on the output to reduce the output power. Thus, in FIG. 3, for example only, in the transmitter 12, the 33 MHz VCO 94 generates its output on line 95 as one input to NOR gate 96. The IF oscillator 98 generates a 9 MHz signal on line 102 as one input to NOR gate 100. A gating signal, as will be shown hereafter, is applied on line 104 as the other input to the NOR gates 96 and 100. The outputs of the two NOR gates 96 and 100 are coupled to mixer 104. The resulting summed output, 42 MHz in this example, is applied on line 106 to RF amplifier 108. The output of amplifier 108 on line 110 passes through an attenuator 112 and reverse coupled diodes 114 as the exciter signal on line 116 to the tank circuit 30 to cause the same nuclei to generate an NMR signal. Reverse-coupled diodes 114, the $\lambda/4$ conductor 14 and reverse-coupled diodes 115 form the transmit/receive switch 71 in FIG. 2. When transmitter 12 generates an output signal to attenuator 112, reverse-coupled diodes 114 assume a low impedance, Z, and the transmitter output signal is coupled to tank circuit 30. However, receiver 14 is isolated because the input resistance, $R_{in}$, is equal to the impedance, $Z_o$, of the $\lambda/4$ conductor section 111 squared divided by the reverse-coupled diode 115 resistance, $R_o$. Since $R_o$ assumes a low impedance when the transmitter generates an output pulse, $R_{in}$ goes very high and isolates the receiver 12. When the transmitter 12 is off, the reverse-coupled diodes 114 and 115 assume a high impedance isolating transmitter 12 and providing a matched input impedance, $R_{in}=Z_o$, to receiver 14.

The NMR signal received by the tank circuit 30, as a result of the pulsing of the signal from the transmitter 12, is coupled on the $\lambda/4$ section of cable 111 to a 28 dB non-inverting RF preamplifier 120 to improve the signal-to-noise ratio. The RF output on line 122 is coupled as one input to mixer 124 in receiver 14.

Figure 6:
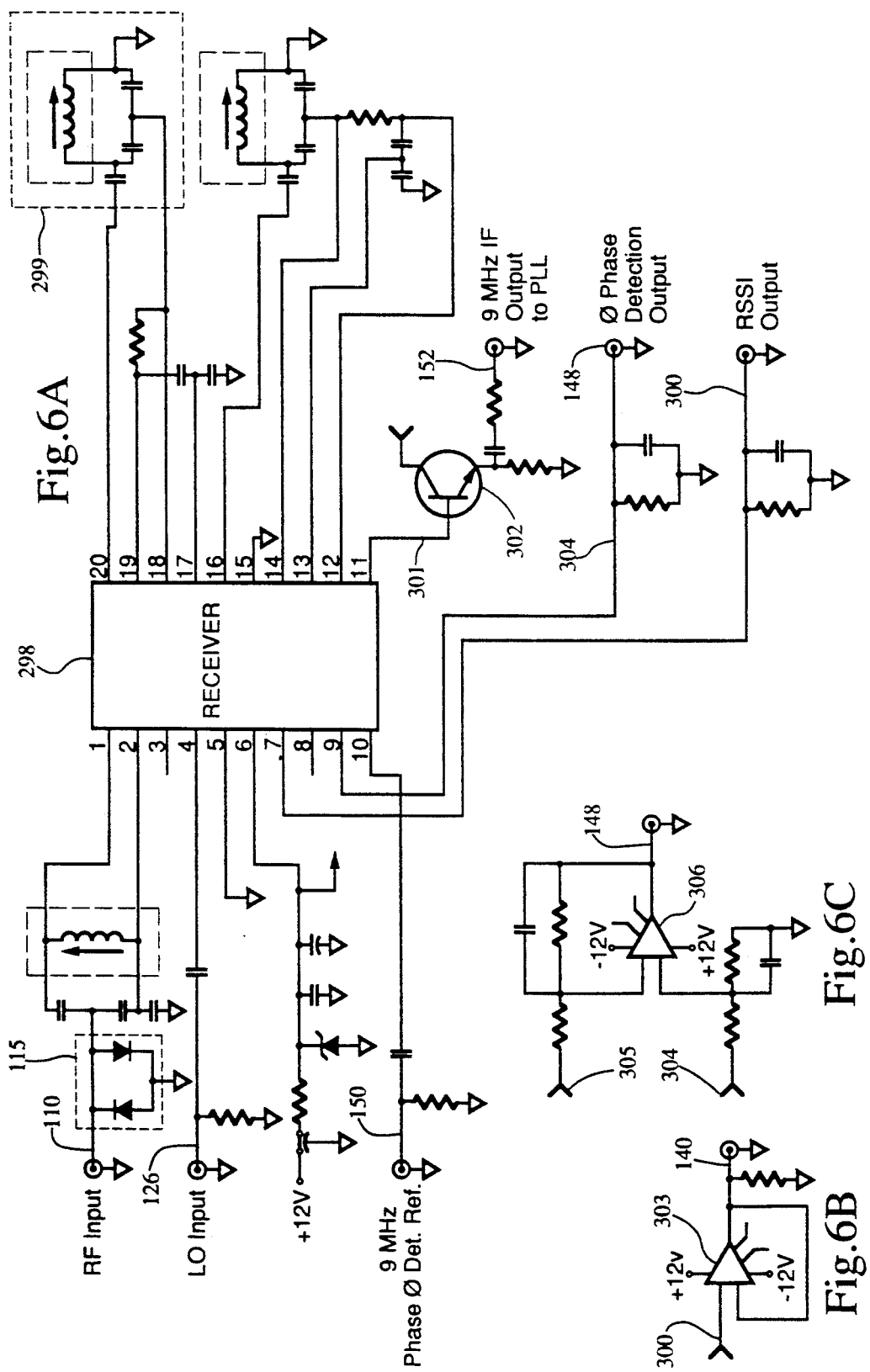
FIG. 6A is a detailed circuit diagram of the single chip receiver illustrated generally in FIG. 2.
FIG. 6B illustrates an optional buffer for the RSSI line in FIG. 6A.
FIG. 6C is a circuit diagram of an optional zero centered buffer circuit for the phase detector output of FIG. 6A.

The receiver consists of a single chip, shown in detail in FIG. 6A, that may be a Signetics NE605 FM receiver which has several unique features. The monolithic chip contains a two-stage IF amplifier designed as a successive detection log strip with 100 dB gain. Since the strip is designed for FM applications, the IF clips the signal to eliminate AM noise on the carrier. This is very desirable for the lock since the IF output is used to clock an edge-triggered digital phase detector (not shown) in the spectrometer where only zero-crossing information is required. The effect of the clipping on strong signals causes the chip to act as a limiter and improves the signal-to-noise ratio preceding the phase detector and sacrifices very little signal-to-noise ratio when the signal is noisy.

The VCO input to the mixer 124 of receiver 14 is on line 126. The VCO signal on line 126 is at a zero DBM level and requires no amplification from the transmitter ECL logic. Line 126 is also a coaxial cable coupled to the output of NOR gate 128 in transmitter 12 which has as one input on line 130 the 33 MHz signal from the VCO 94. The other input on line 132 is the gating signal 104. Thus, when gate signal 104 is present on line 132, the NOR gate 128 provides a 33 MHz signal on line 126 to the mixer 124 in the receiver 14. The two IF amplifiers 134 and 136 are serially connected and their outputs are summed at 138 to generate a signal on line 140 which is called the RSSI (Received Signal Strength Indicator) line. The signal on line 140 is useful to determine the signal-to-noise ratio of the receiver and for use by further logic to determine when to re-excite the nuclei to provide proper operation of the phase detector as will be seen in relation to FIG. 8. Alternatively, this signal on line 140 may be used in conjunction with a microprocessor (not shown) to acquire the initial lock. The microprocessor initiates a fast search mode until the signal is detected within the IF bandwidth of the receiver and then enters a slow mode to enable the phase detector to furnish the lock. This microprocessor could also be used to automatically adjust the frequency set control 190 in PLL 16 shown in FIG. 3.

The output of the second IF amplifier 136 is coupled on line 142 to an emitter follower gate 144 and a phase detection circuit 146 (a Gilbert cell) which is used as the FM demodulator. When the 9 MHz IF reference signal on line 150 is applied to it, the detector 146 will function as a conventional NMR phase detector and produce an FID signal on line 148. Alternately, when locked, this detector 146 will provide a maximum output and can be used as a lock indicator if desired. When the phase detector 146 is used to display the FID signal, it is not zero centered since the receiver chip 298 (in FIG. 6A) is only powered by a unipolar 6-volt supply. Because the Gilbert cell forming the analog phase detector has push-pull outputs that are matched (pins 8 and 9 of receiver chip 298 in FIG. 6A), these outputs can be used to drive a differential operational amplifier which is powered from a plus/minus 12-volt supply, thus furnishing a 0-centered FID signal. See FIG. 6C for such differential amplifier. An additional feature of the IF amplifiers 134 and 136 in the NE605 receiver chip 298 shown in FIG. 6A is the low phase shift they exhibit due to the process used in their fabrication. The collector capacitance is very low and the amplifiers exhibit only a few degrees phase shift over a wide range of signal amplitudes. In general, the bandwidth of the IF circuits will be narrow and therefore dominated by the phase shift of the single or double pole crystal filter 156 shown connected to IF amplifier 134 shown in FIG. 3 and which is shown connected to the receiver chip 298 as block 299 in FIG. 6A. With the present circuit, the voltage controlled oscillator injection signal on coaxial cable 126 to the receiver tracks the nuclear resonant frequency of the sample to maintain the signal centered in the IF bandpass when locked. The output of the analog phase detection circuit 146 on line 148 can be used by digital logic or a microprocessor for data analysis as described hereafter. The other input to the phase detector 146 on coaxial cable 150 is the intermediate frequency 9 MHz signal from the IF oscillator 98 in the transmitter 12. The output of the receiver 14 on line 152 is the feedback loop control signal and is coupled to the gated phase lock loop control system 16. The signal on line 156 is coupled first to amplifier 160 which has an output on line 62 that is one input to a first NOR gate 164. A 9 MHz reference signal on coaxial cable 166 from the IF oscillator 98 in transmitter 12 is coupled to amplifier 168. The output of amplifier 168 on line 170 is coupled as one input to a second NOR gate 172.

The phase lock loop 16 is required to operate at 9 MHz, the IF frequency. A digital edge-triggered phase detector, while more susceptible to noise, can provide superior performance over an analog phase detector. Until recently, digital phase detectors exhibited a dead zone at lock which became worse at higher frequencies and resulted in excessive phase noise. Today, two digital phase detectors have been introduced which circumvent these problems in a similar fashion. One of these detectors is the Philips 74 HC/HCT 4046A and the second, used in the present invention, is known as the AD9901. It is compatible with ECL logic and it can be operated in a push-pull mode to improve power supply noise rejection. More importantly, in the push-pull mode, the average level of the output pulses, when locked, are easily cancelled out in a differential integrator. Also included in the AD9901 design is a frequency detector which overrides the phase detector when two transitions are clocked on one side before the opposite side clocks. The frequency detector prevents false locks and allows quick acquisition of the locked state. Special precautions are required to avoid clocking as the phase loop is enabled/disabled during the nuclei exciting time. These additional precautions are provided, as will be seen in FIG. 5, by an MC10131 flip-flop 242 and steering gates 244 and 246. The purpose of this circuit is to enable the receiver IF side when the signal-to-noise ratio is highest and disable it on the crystal reference side when the signal-to-noise ratio is lowest as will be explained in relation to FIG. 5.

Continuing with the discussion of FIG. 3, the output of mixer 174 in phase lock loop 16 is coupled to the phase detector 176 (the AD9901 detector 238 and CMOS switches 280 in FIG. 5) which also has an input on line 178 which selects a fast or slow frequency bandwidth ($f_n$) as desired to operate the CMOS bilateral switch in the digital phase detection circuit 176. A microprocessor (not shown) would go into a search mode and sweep the oscillator frequency in a fast mode to acquire the resonant frequency and then switch to a slow mode to maintain the frequency lock. The use of such microprocessor is old and well known. The output of the digital phase detection circuit 176 on line 180 is coupled to an AFC switch 182 which may be either "on" or "off". The output of the AFC switch 182 on line 184 is coupled as one input to an inverting operational amplifier 186. The other input on line 188 is from a frequency set potentiometer 190. The output of the inverting operational amplifier 186 on lines 192 and 194 are coupled to the voltage controlled oscillator 94 in transmitter 12 for adjusting the frequency thereof and locking to the NMR frequency.

FIGS. 4A and 4B are detailed circuit diagrams of the transmit module 12 illustrated in FIG. 3. Voltage controlled oscillator chip 202 in FIG. 4A is the heart of VCO circuit 94 and has the signals from the feedback loop 16 on lines 192 and 194 coupled as inputs thereto. These signals pass through operational amplifier 198 and coupling transformer 200 to the oscillator chip 202. Oscillator 202 may be of the type known as MC1648 which produces an output frequency on line 204 that varies according to the input voltage on lines 192 and 194. The output of the oscillator 202 on line 204 is coupled as one input to both NOR gates 96 and 128. The gating signal for NOR gates 96 and 128 are derived from the input gating signal on line 104 from the circuit illustrated in FIG. 8. If transister-transister logic (TTL) is used, the circuit illustrated in block 208 is utilized. The output from circuit 208 is coupled as an input to NOR gate 206. An inverted and normal signal appear at the output of NOR gate 206 on lines 208 and 210 as indicated. The normal signal is coupled as a gating signal to NOR gate 128 to produce the output signal on line 126 to the receiver mixer 124 in FIG. 3 as the 33 MHz oscillator signal. The inverted signal is coupled as a gating signal to NOR gate 96 to cause the VCO signal on line 97 that is coupled to the mixer 220 shown in FIG. 4B.

Figure 5:
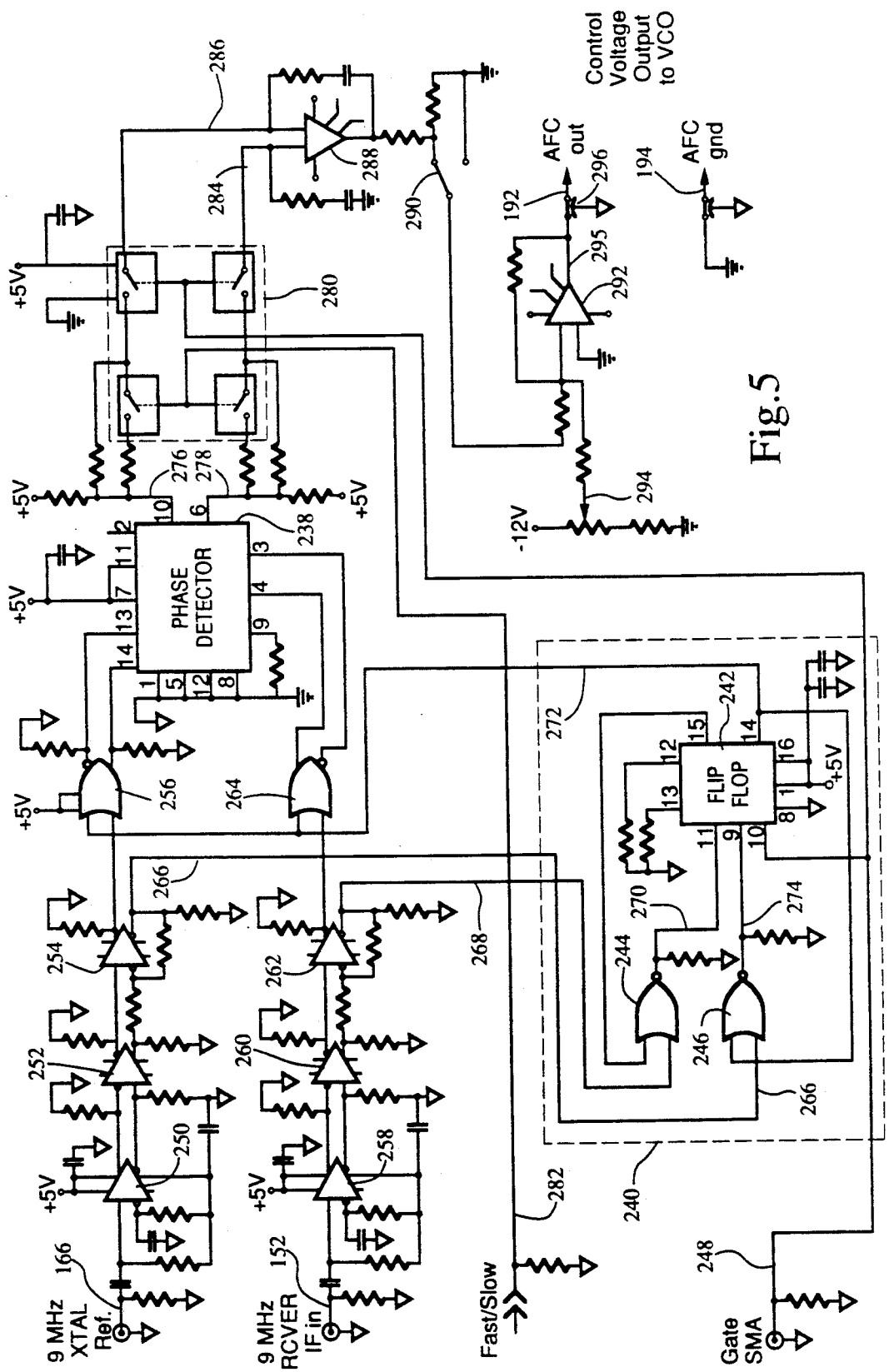
FIG. 5 is a detailed circuit diagram of the gated phase lock loop control circuit for generating the control voltage coupled to the voltage controlled oscillator.

The 9 MHz oscillator 98 in FIG. 3 is shown in detail in FIG. 4A and includes a crystal oscillator 211 that generates a stable output signal on line 212. The signal on 212 is coupled as one input to NOR gates 100, 165 and 149. The output of NOR gate 149 on line 150 is coupled to the receiver chip 298 illustrated in FIG. 6A. The output of NOR gate 165 on line 166 is coupled to the phase locked loop as shown in FIG. 5. NOR gate 100 has as the other input on line 214 a gating signal from NOR gate 216. NOR gate 216 is triggered by the gating signal present on input line 104. The output of NOR gate 100 on line 101 is coupled to the mixer 220 shown in FIG. 4B. NOR gate 218 in the VCO circuit 94 produces an output on line 196 that can be used for testing or other purposes as needed such as an input to a second spectrometer.

Referring now to FIG. 4B, the VCO signal on line 97 and the 9 MHz signal on line 101, both from FIG. 4A, are coupled to mixer 220 in FIG. 4B. The VCO signal passes through inverter 222 to the mixer 220. The output of the mixer 220, which may be an IC chip of the type designated SCM-1, on line 223 is coupled to a first RF amplifier 224, attenuator 226, bandpass filter 228 and second RF amplifier 230. The output of the second RF amplifier 230 on line 231 is coupled through reverse-coupled diodes 229 which help isolate the transmitter when it is shut off. The signal is then coupled to a Class C amplifier 232 which requires no gating and reduces power dissipation. The output of amplifier 232 through reverse-coupled diodes 114 on line 234 is the RF output for pulsing the tank circuit 30 in FIG. 3. Diodes 114 are part of the transmit/receive switch explained earlier in relation to FIG. 3.

Figure 8:
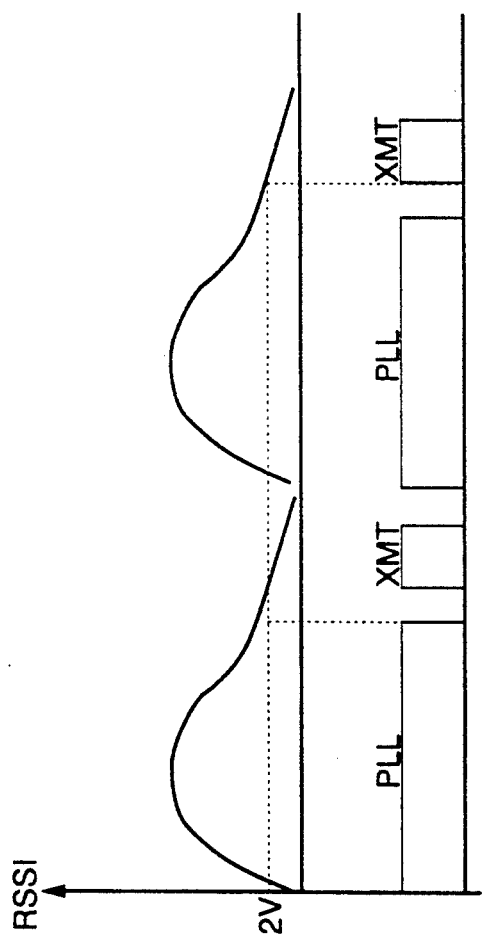
FIG. 8 is a graph illustrating the relationship between the phase lock loop enable signals, the transmitter excitation pulses and the RSSI output.

FIG. 5 discloses the gated phase lock control loop used to obtain the resonant frequency lock. The phase detector I.C. chip 238 is the Analog Device AD9901 which can be used for TTL or ECL operation up to 200 MHz. It is, however, in this case required to operate at 9 MHz. It is a digital edge-triggered phase detector. While such detector is more susceptible to noise, it can provide superior performance over an analog phase detector. As indicated, the AD9901 phase detector 238 is employed in this design to be compatible with ECL logic and because it can be operated in a push-pull mode to improve power supply and noise rejection. More importantly, in the push-pull mode, the average level of the output pulses when locked are easily cancelled out in a differential integrator. Included in the design of the digital phase detector 238 is a frequency detector 240 which overrides the phase detector when two transitions are clocked on one side before the opposite side clocks. The frequency detector 240 prevents false locks and allows quick acquisition of the lock state. However, special precautions are required to avoid clocking it as the phase loop is enabled/disabled during the time the nuclei is being excited. These precautions are provided by the detector in block diagram 240 which includes an IC chip MC10131 flip-flop 242 and steering gates 244 and 246. The operation of circuit 240 enables the receiver IF input (from FIG. 6A) on line 152 when the signal-to-noise ratio is highest and disables the crystal reference input on line 166 when the signal-to-noise ratio is lowest. Thus, in FIG. 5, the 9 MHz crystal reference signal on line 166 passes through serially coupled integrated circuit chips 250, 252 and 254 as one input to NOR gate 256. In like manner, the signal on line 152 is the receiver IF signal and is connected to serially coupled integrated circuit chips 258, 260 and 262 to NOR gate 264 as one input. Thus, when the signal-to-noise ratio is highest, the output of integrated circuit chip 262 on line 268 is coupled as one input to NOR gate 244 in circuit 240. Flip-flop 242 also has outputs that are coupled to the steering gates 244 and 246. Steering gate 244 produces an output on line 270 to pin 11 of flip-flop 242. The enable/disable signal on line 248 from FIG. 8 is also coupled as an input to flip-flop 242 thus causing it to produce an output on line 272 that enables the NOR gates 256 and 264. When the signal-to-noise ratio is the lowest, integrated circuit 254 generates an output signal on line 266 which is coupled to NOR gate or steering gate 246 which generates an output on line 274 to flip-flop 242 to disable it when the enable pulse is present on line 248. Thus, there is no output on line 272 from flip-flop 242 and NOR gates 256 and 264 are disabled.

The outputs of the NOR gates 256 and 264 are coupled to the phase detector integrated circuit chip 238 which is the type known as AD9901. The outputs of the phase detector 238 on lines 276 and 278 are coupled to the CMOS quad bilateral switch 280 which may be an IC chip of the type designated 4066. The quad bilateral switch 280 is gated on and off by the signals on line 248 from FIG. 8 and adds or deletes a parallel resistor to obtain fast or slow response by using the fast/slow signals on line 282 from a microprocessor (not shown), as explained earlier. The outputs of the bilateral switch 280 on lines 284 and 286 are coupled to an inverting operational amplifier 288 whose output is coupled to an AFC switch 290. The output of the AFC switch is coupled to a second inverting operational amplifier 292 as one input. The potentiometer 294 is also coupled to the same input terminal as the output of the AFC switch 290 to provide a means for a coarse setting of the frequency and, as stated earlier, could be automatically controlled by a microprocessor. The output of the second inverting operational amplifier 292 on line 295 passes through a feed-through capacitor 296 as the AFC output control voltage on lines 192 and 194 to the voltage controlled oscillator 94 in the transmitter 12 in FIG. 3, as previously explained in relation to FIG. 4A.

FIG. 6A is a detailed diagram of the single chip receiver circuit 14 shown generally in FIG. 3. The receiver 14 consists primarily of a single integrated circuit chip 298. Chip 298 may be a Signetics NE605 FM receiver which has several unique features. The monolithic chip 298 contains a two-stage IF amplifier designed as a successive detection log strip with 100 dB gain. Since the strip is designed for FM applications, the IF clips the signal to eliminate AM noise on the carrier. This is a desirable feature for the lock since the IF output on line 152 is used to clock the edge-triggered digital phase detector 238 in the phase lock loop shown in FIG. 5. Only zero-crossing information is required. As stated previously, this effectively causes the chip to be a limiter circuit on strong signals and improves the signal-to-noise ratio preceding the phase detector 238 in the phase lock loop when the signal is noisy. Successive detection in the single chip receiver 298 also outputs a signal from pin 7 of receiver 298 on line 300 that is proportional to the log compressed strength of the incoming signal on line 110 over a 90 dB dynamic range. This signal on line 300 is the RSSI output signal and is useful to determine the signal-to-noise ratio of the signal and for further logic to determine when to re-excite the nuclei to provide proper gating of the phase detector 238 in the phase lock loop illustrated in FIG. 5. The signal on line 300 is illustrated in FIG. 8 where it is used to determine the pulse sequence logic for the phase lock loop enable signal and the transmitter gate signal. Additionally, this signal can be used in conjunction with a microprocessor (not shown) to acquire the initial lock, as stated earlier. The microprocessor can initiate a search mode until the signal is detected within the IF bandwidth of the receiver and then enable the phase detector 238 in FIG. 5 to furnish the lock.

The receiver local oscillator injection signal on line 126 is at a zero DBM level and requires no amplification from the transmitter ECL logic. The mixer, not shown in FIG. 6A because it is an integral part of the single chip receiver 298, is preceded by a +28 dB non-inverting RF preamplifier 120 shown in FIG. 3 to improve the signal-to-noise ratio. The pre-amp 120 could be incorporated in the receiver chip 298. Pin 11 of receiver chip 298 is coupled on line 301 through an emitter follower 302 to provide an output on line 152 to the phase lock loop 16 illustrated in FIG. 3 and in FIG. 5. In this manner, the desired bandwidth is established. The reversed-coupled diodes 115 at the RF input on line 110 form a part of the transmit/receive switch 71 in FIG. 2, as explained previously.

The single chip receiver 298 also contains an onboard analog phase detector which is used as the FM demodulator. When the 9 MHz reference signal on line 150 is applied to pin 10, the detector will function as a conventional NMR phase detector and produce an FID signal on pin 9 of receiver 298 on line 304. Alternately, when locked, this detector output will provide a maximum output signal and can be used as a lock indicator if desired.

When the analog phase detector in the single chip receiver 298 is used to display the FID signal on pins 8 and 9 of the single receiver chip 298, it is not zero centered since the chip is only powered by a unipolar 6-volt supply. Because the phase detector has push-pull outputs that are matched on pins 8 and 9, these outputs can be used to drive a differential operational amplifier, as illustrated in FIG. 6C, which is powered by a plus/minus 12-volt supply illustrated in FIG. 12, thus furnishing a zero-centered FID signal. Thus, line 305 in FIG. 6C is coupled to pin 8 of receiver chip 298 and line 304 is coupled to pin 9. The output is on line 148.

An additional feature of the IF amplifier in the NE605 single chip receiver 298 is the low phase shift it exhibits. The collector capacitance is very low and the amplifier exhibits only a few degrees phase shift over a wide range of signal amplitudes. In general, the bandwidth of the IF amplifier will be narrow and therefore dominated by the phase shift of the crystal filter 156 shown in FIG. 3. In the present design, the receiver local oscillator injection signal on line 126 in FIG. 3 and FIG. 6A tracks the nuclei resonant frequency to maintain the signal centered in the IF bandpass when locked.

FIG. 6B illustrates an optional buffer circuit which can be used to buffer the RSSI line 300. Operational amplifier 303 has an input on line 300 from pin 7 of the receiver chip 298 and generates an output on line 140 as shown in FIG. 3.

Tank circuit 299 can be replaced with the crystal filter 156 in FIG. 3 for operation with a narrower bandwidth.

Crystal filter 156 illustrated in FIG. 3 has a construction well known in the art; it will not be discussed here in detail. Suffice it to say that the receiver bandwidth is reduced from 1 MHz to 15 KHz by adding crystal filter 156 on its output as illustrated in FIG. 6A. The single chip receiver 298 may be modified to include the non-inverting RF preamplifier 120 shown in FIG. 3 and may also include the buffer circuit shown in FIG. 6B for buffering the RSSI line 300. In addition, as stated previously, the circuit shown in FIG. 6C may be used with the phase detector output on line 304 to zero shift the phase detected output. The 9 MHz IF output on line 152 may also be used with a complementary emitter follower or FET serving as a buffer to drive the 50 ohm coaxial line.

Figure 7:
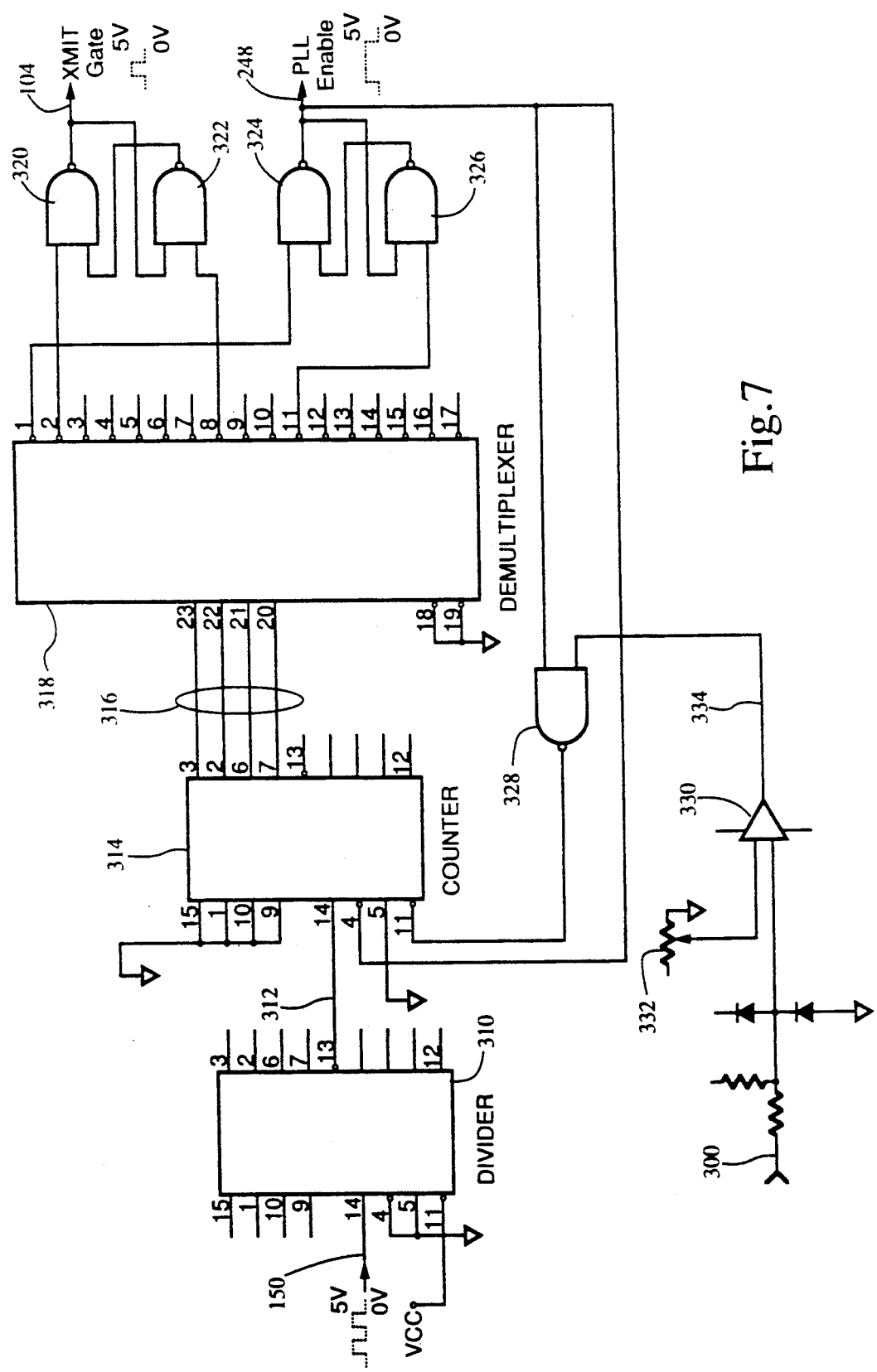
FIG. 7 is a block diagram of a circuit for generating the gating pulses for the transmitter and the phase lock loop.

FIG. 7 illustrates the gate signal generating circuit having a 9 MHz crystal reference signal input on line 150 from FIG. 4A to an up/down decade counter/divider chip 310 whose output on line 312 is coupled to a 4-bit up/down binary counter chip 314. The 4-bit output on lines 316 is coupled to a 4-to-16 line decoder/demultiplexer chip 318. The divide circuit 310 may be a 74HC190 chip, the 4-bit up/down binary counter 314 may be a 74HC191 chip and the 4-16 line decoder/demultiplexer 318 may be a 74HC154 chip. NOR gates 320 and 322 receive outputs from the decoder 318 and provide the transmitter gate pulses on line 104. NOR gates 324 and 326 also receive outputs from the demultiplexer 318 and provide the phase lock loop enable pulses on line 248. A Schmidt trigger 328 receives the RSSI signal on line 300 which is coupled through an operational amplifier 330. A potentiometer 332 allows the signal-to-noise ratio output of the operating amplifier 330 to be adjusted. The output of amplifier 330 on line 334 is coupled as an input to the Schmidt trigger 328. Thus, the timing of the transmitter gate signal on line 104 is determined by the signal strength of the RSSI signal on line 300. This can be better illustrated in relation to FIG. 8 which shows the relationship of the RSSI signals, the phase lock loop enable signal and the transmit gate signal. When the RSSI signal is above a predetermined level, for example, 2 volts as illustrated in FIG. 8, the phase lock loop enable pulse is generated on line 248 by the circuit in FIG. 7. When the RSSI signal decays below the 2-volt level, the circuit in FIG. 7 then causes the transmitter gate pulse to be present on line 104 to re-excite the nuclei. When the next RSSI signal is detected above the predetermined level, the phase lock loop gate signal on line 248 is again generated as shown.

The gain of the VCO 16 is given as the change in angular frequency per volt. Experimentally it can be measured as the frequency change of the VCO per unit change of the integrator output voltage as illustrated by the equation $$K_o = \Delta\Omega/\Delta v = \frac{2\Pi(32.801 - 32.795 \text{ MHz})}{11 \text{ v}}\left(\frac{1}{200}\right), \quad (1)$$

or $$K_o = 3.4 \times 10^3 \text{ rad/v} \quad (2)$$

where $\Delta\Omega$ equals the angular frequency change of the VCO and $\Delta v$ equals the integrator output voltage change. $K_o$ was measured with a 200:1 attenuator installed to limit the range of the integrator. By using an attenuator with an 80:1 ratio, tracking is allowed over a ±15 KHz range with a final $$K_o = 8.5 \times 10^3 \text{rad/v}.$$

Figure 9:
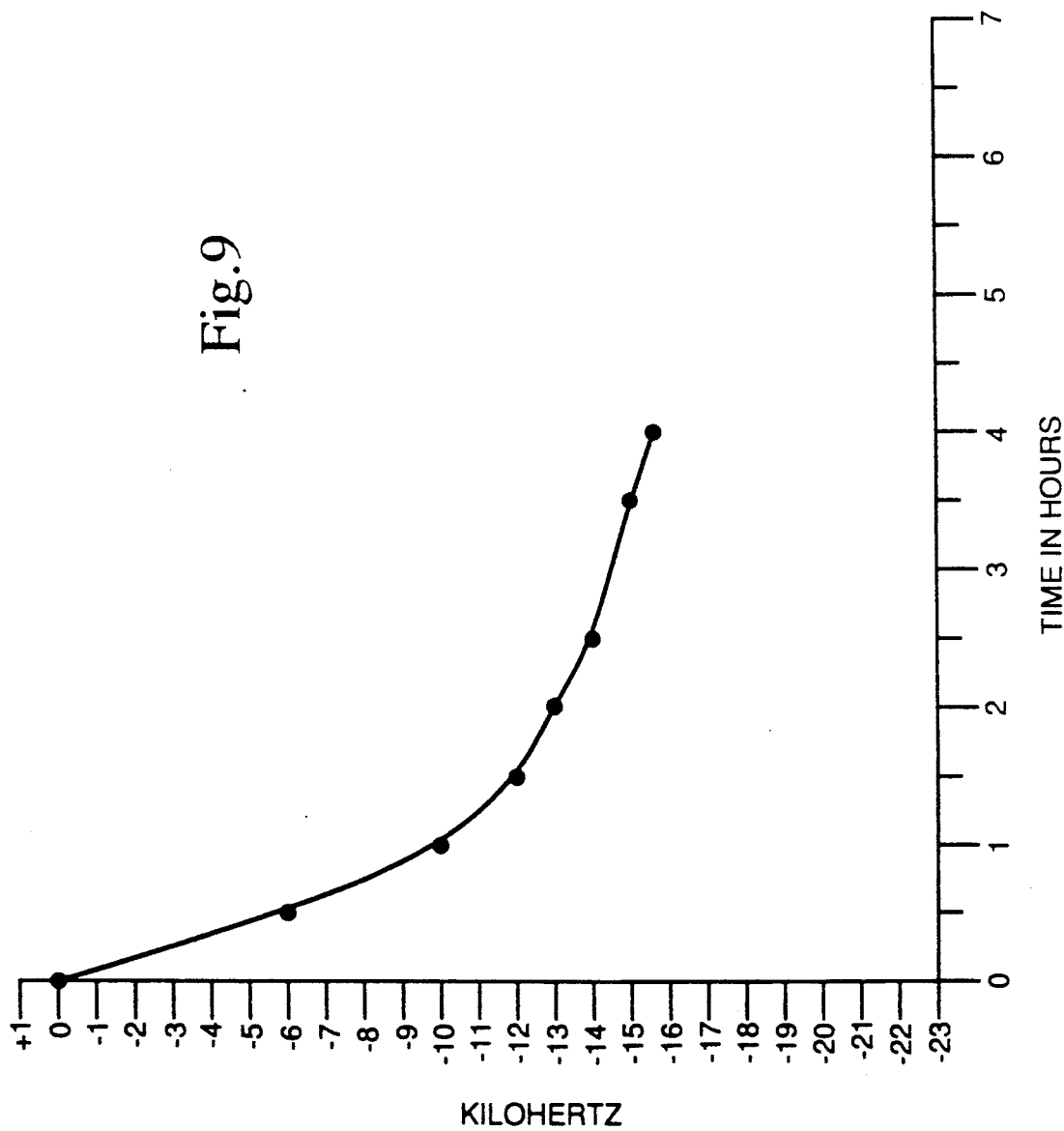
FIG. 9 is a graph illustrating the voltage controlled oscillator frequency drift when the VCO is free-running.
Figure 10:
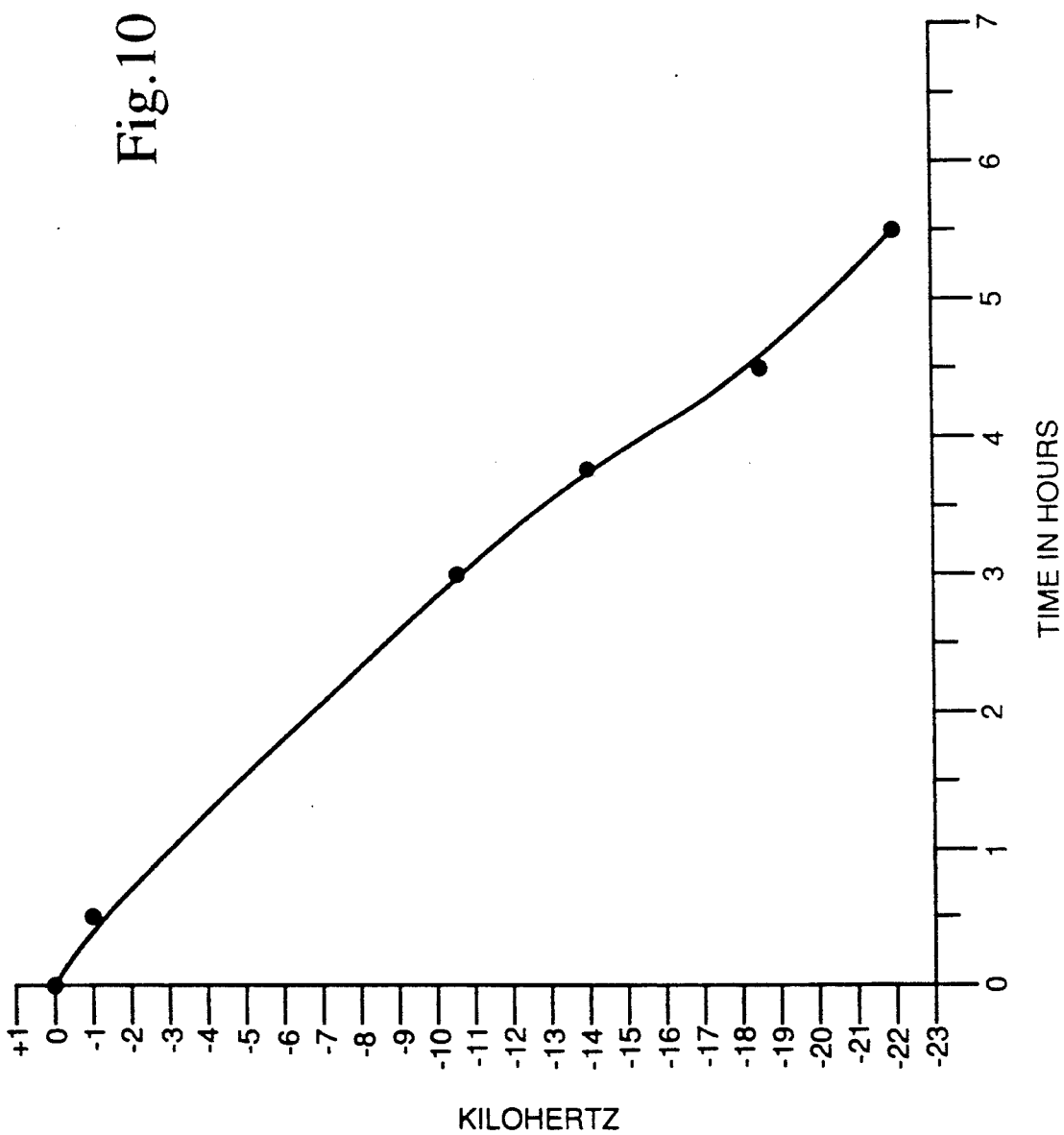
FIG. 10 is a graph of the frequency drift of the VCO after the VCO is locked to the protons in the nuclei.

The VCO drift was measured when unlocked and is illustrated in FIG. 9. Assuming an increase in temperature from the initial turn-on of the VCO, the temperature coefficient is negative and is due to the tank components which have neither been compensated nor thermally controlled. The inductor 200 (in FIG. 4A) is wound on a powdered iron toroid of Grade 6. Its temperature coefficient is not listed, but is in the order of +100 ppm/°C. The fixed padding capacitors 201 are of the NPO/COG type and are listed at 0±30 ppm/°C. The voltage variable capacitors 199 are rated at typically +280 ppm/°C. The temperature coefficients are all positive which result in a negative temperature coefficient for the oscillator. The oscillator padding capacitors 201 can be changed to have a negative temperature coefficient to reduce the drift as long as the magnet is temperature stable. It is also possible to increase the negative temperature coefficient of the powdered iron core 200 to that of a ferrite material to match the drift of the magnet without temperature control. When the match is close, the PLL tracking range is not large and can easily follow the thermal time constant of the magnet. Tank components must be mechanically rigid and stable. The toroid may be potted; a shielded pot core is also suitable. Surface mounting varicap capacitors are desired. Metal shields and covers located around the tank must be heavy enough so as not to alter the stray capacitance.

Figure 11:
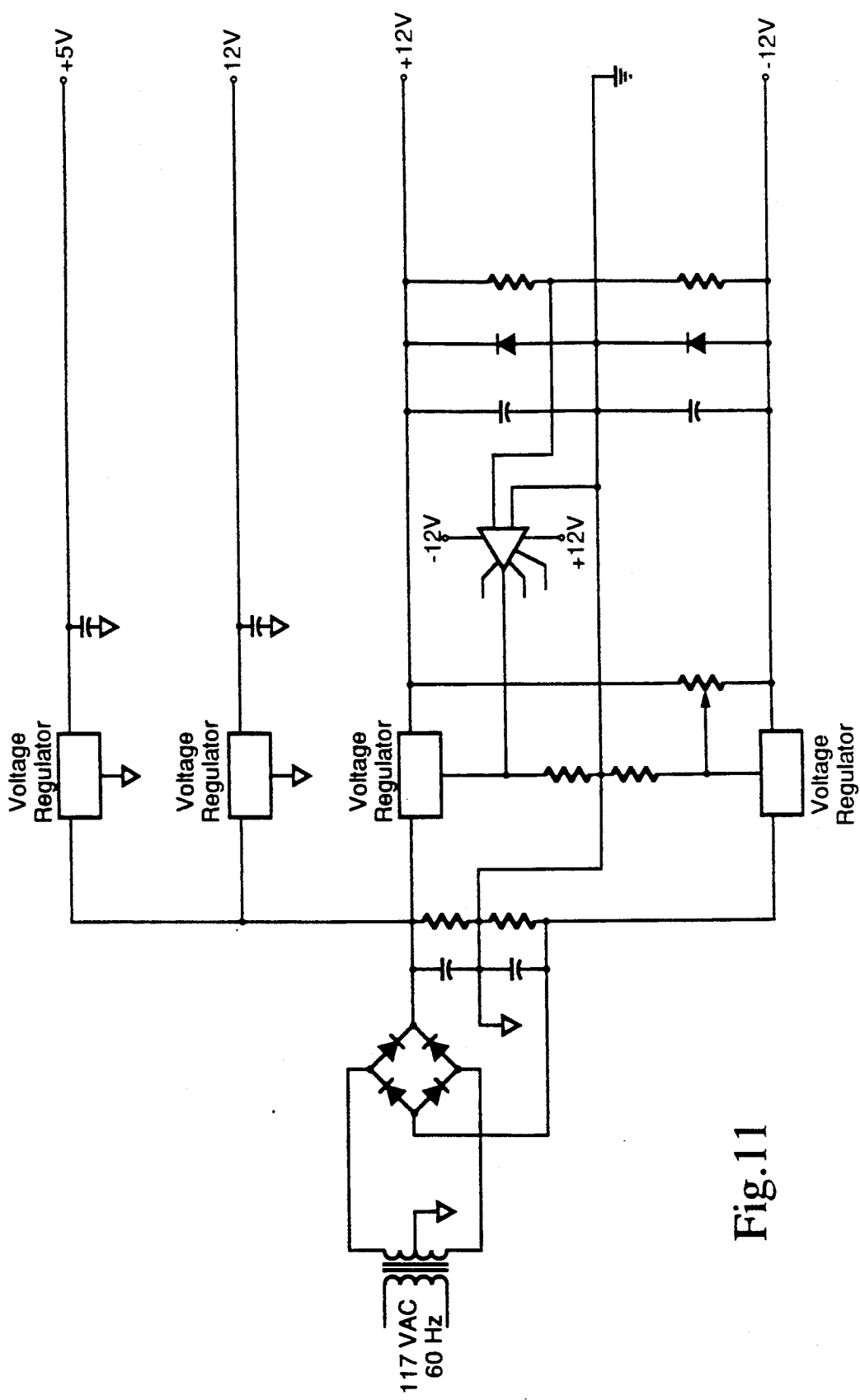
FIG. 11 is a generalized circuit diagram of the power supply for the circuits of the present invention.

The phase lock loop tracking range is ±15 KHz in order to track the temperature change of the magnet when shim coils are used to produce a homogeneous field. Initially, the drift starts at 5 Hz/second. A plot of the drift when the VCO is locked to the proton is illustrated in FIG. 11. The plot covers 5½ hours. The time of a full cycle has not been established. The graph takes into account the initial drift of the VCO caused by the additional heat generated when the shim coils are energized. The wide bandwidth of the phase lock loop allows the VCO to track the magnet's field transient when the shim coils are energized.

Figure 12:
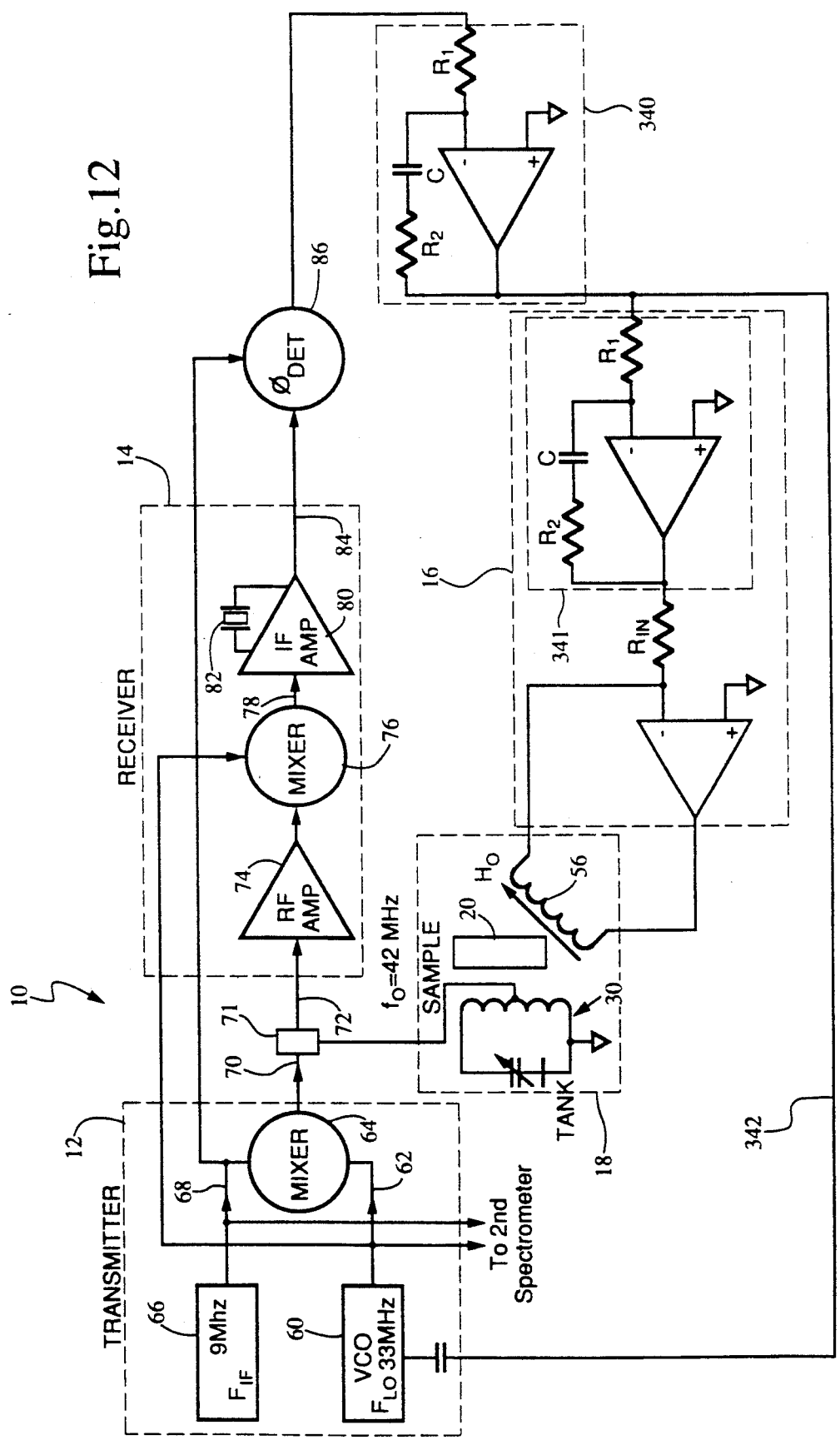
FIG. 12 is a block diagram of a circuit that can be used as an alternate embodiment to drive the magnetic field adjusting coil with a single conversion superheterodyne receiver.

A typical power supply for the NMR lock circuit is illustrated FIG. 12. It produces ±12 v as well as +5 v in a typical fashion using voltage regulators.

FIG. 12 is a circuit block diagram illustrating alternative embodiments of the present invention. As stated earlier, one of the disadvantages of the prior art is the use of a double conversion superheterodyne receiver to vary the magnetic field (created by magnets other than those formed with rare earth materials) to maintain frequency lock. The present invention enables the single conversion receiver to be used in such manner. In FIG. 12, transmitter 12, transmit/receive switch 71, receiver 14, and phase detector 86 are identical to their like components in FIG. 2 except that the VCO 60 operates at a fixed frequency. Feedback loop 16 and excitation circuit 18 are identical to their like components in FIG. 1. The reason that the output of phase detector 86 in FIG. 2 cannot drive the excitation circuit 18 of FIG. 1 is that the frequency is too high. The change in the coil inductance, L di/dt, is affected by the value di/dt, as a function of frequency. As the frequency increases, it is increasingly difficult for the excitation coil to respond to the input signal. Consequently, the prior art uses the 1 KHz offset frequency to compensate for this problem and provide a low frequency for driving the feedback coil 56.

In the present invention, as shown in FIG. 12, a filter 340 is placed in series with the filter 341 in the feedback circuit 16. These filters are wideband filters that reduce the frequency from the phase detector 86 to a value that can be used to drive the feedback coil 56 in excitation circuit 18. An increased driving voltage is required because of the L di/dt effects on the excitation feedback coil 56. Thus, an improved circuit is disclosed in FIG. 12 for using the simple and more economical single conversion superheterodyne receiver of FIG. 2 to drive the feedback excitation coil 56.

Although the circuit of FIG. 12 as described can be used with electromagnets to operate at a fixed frequency, the increased bandwidth caused by filters 340 and 341 still has the requirement for the larger driving voltage as set forth above. By adding coupling 342 from the output of filter 340 to the VCO 60 in transmitter 12, a negative feedback loop is established at higher frequencies that reduces the phase noise of the VCO 60 to give greater accuracy in locking and causes the fixed frequency of the VCO 60 to take on the high-frequency characteristics of the nuclei frequency. Thus, such circuit as in FIG. 12 with the negative feedback loop 342 may be beneficial when used with NMI (Nuclear Magnetic Imaging) devices.

There has been disclosed a novel nuclear magnetic resonance locking circuit which is much less complicated than prior art circuits and which can be successfully employed not only with electromagnets, superconducting magnets and permanent magnets, but also with magnets formed of ultrahigh energy material such as neodynium. The circuit is designed with a frequency locking mechanism that responds to a variable frequency instead of changing the magnetic field strength applied to the sample. The resonant frequency of the nuclei is compared to a variable frequency excitation from a voltage controlled oscillator which is adjusted to maintain a fixed offset frequency used to generate a control voltage having one unique value of zero.

The foregoing specification describes only the embodiments of the invention shown and/or described. Other embodiments may be articulated as well. The terms and expressions used, therefore, serve only to describe the invention by example and not to limit the invention. It is expected that others will perceive differences which, while different from the foregoing, do not depart from the scope of the invention herein described and claimed. In particular, any of the specific constructional elements described may be replaced by any other known element having equivalent function.

I claim:

1. A device for use in nuclear magnetic resonance spectroscopy for locking to the resonant frequency of the nuclei of a test sample comprising:
    a permanent magnet for applying a fixed magnetic field to said nuclei;
    a transmitter, including a local oscillator, for generating a variable frequency signal for exciting said nuclei;
    an RF coil coupled to the transmitter for applying said variable exciting frequency signal to said nuclei to resonate said nuclei and cause a resonant frequency signal, offset from the local oscillator frequency, to be generated by said nuclei in the presence of the fixed magnetic field;
    receiver means coupled to said RF coil for combining the generated resonant frequency with the transmitter local oscillator frequency to obtain a free induction decay difference frequency; and
    a feedback loop coupled to said receiver combining means and said local oscillator for using said difference frequency to obtain said lock by adjusting the local oscillator frequency such to maintain the offset frequency such that the transmitter generates the variable exciting frequency.

2. A device as in claim 1 wherein said transmitter further comprises.
    means for generating the offset frequency; and
    means for combining said offset frequency and said local oscillator frequency to generate said variable frequency for exciting said nuclei.

3. A device as in claim 2 wherein said receiver comprises:
    means for amplifying said nuclei resonant frequency signal; and
    means for subtracting said amplified nuclei resonant frequency signal from said local oscillator frequency signal to obtain said free induction decay difference frequency.

4. A device as in claim 3 further comprising:
    means coupled to said free induction decay difference frequency and said means for generating said offset frequency to develop a control frequency; and
    means in said feedback loop utilizing said control frequency to adjust said local oscillator frequency to maintain said control frequency at a null.

5. A device as in claim 4 wherein local oscillator is a voltage controlled oscillator.

6. A device as in claim 5 further including means for converting said control frequency to a variable DC voltage for adjusting the frequency of said voltage controlled oscillator.

7. A device as in claim 6 wherein said means for applying a fixed magnetic field to said nuclei is a permanent magnet.

8. A device as in claim 6 wherein said means for applying a fixed magnetic field to said nuclei is an ultrahigh energy product magnet.

9. A device as in claim 8 wherein the ultrahigh energy product magnet is formed with a rare earth material.

10. A device as in claim 9 wherein the rare earth material is of the class including neodynium.

11. A device as in claim 1 wherein the receiver means is a single conversion superheterodyne receiver.

12. A device for use in NMR spectroscopy for locking to the resonant frequency of the nuclei in a sample under test comprising:
    means for applying a fixed magnetic field to said nuclei;
    means including a local oscillator for exciting said nuclei with a variable frequency signal to cause a resonant frequency to be generated by said nuclei in the presence of the fixed magnetic field, the resonant frequency being offset from the oscillator frequency;
    means for combining the generated offset resonant frequency signal with the local oscillator signal to obtain a variable control signal; and
    a feedback loop coupled to said combining means and said local oscillator for utilizing said variable control signal to obtain said lock by adjusting the local oscillator frequency to maintain the offset frequency such that said nuclei excitation frequency is varied with a change in the variable control signal.

13. A method for locking to the resonant frequency of nuclei in nuclear magnetic resonant spectroscopy comprising the steps of:
    applying a fixed magnetic field to said nuclei;
    generating a variable frequency signal with a local oscillator for exciting said nuclei;
    coupling an RF coil to said local oscillator for applying said variable exciting frequency signal to said nuclei in the presence of the fixed magnetic field to resonate said nuclei and cause a resonate frequency signal offset from the local oscillator frequency to be generated by said nuclei;
    coupling a receiver to said RF coil for combining the generated offset resonate frequency with the local oscillator frequency to obtain a free induction decay difference frequency; and
    coupling a feedback loop to said receiver combining means and said local oscillator for using said difference frequency to adjust the local oscillator frequency to maintain the offset frequency such that the local oscillator generates the variable exciting frequency signal.

14. A method as in claim 13 further comprising the steps of:
    generating an offset frequency with a transmitter; and
    combining said generated offset frequency and said local oscillator frequency to generate said variable frequency for exciting said nuclei.

15. A method as in claim 14 further comprising the steps of:
    amplifying said nuclei resonant frequency signal; and
    subtracting said amplified nuclei resonant frequency signal from said local oscillator frequency signal to obtain said free induction decay difference frequency.

16. A method as in claim 15 further comprising the steps of:
    developing a control frequency with said free induction decay difference frequency and said generated offset frequency; and
    utilizing said control frequency in a feedback loop to adjust said local oscillator frequency to maintain said control frequency at a null.

17. A method as in claim 16 further comprising the step of using a voltage controlled oscillator as said local oscillator.

18. A method as in claim 17 further including the step of converting said control frequency to a variable DC voltage for adjusting the frequency of said voltage controlled oscillator.

19. A method as in claim 18 further comprising the step of applying a fixed magnetic field to said nuclei with a permanent magnet.

20. A method as in claim 19 further comprising the step of applying a fixed magnetic field to said nuclei with a magnet formed from an ultrahigh frequency energy product material.

21. A method as in claim 20 further comprising the step of forming the ultrahigh frequency energy product magnet from a rare earth material.

22. A method as in claim 21 further comprising the step of using rare earth materials of the class including neodynium to form the ultrahigh energy product magnet.

23. A method as in claim 13 further comprising the step of using a single conversion superheterodyne receiver for comparing the nuclei generated resonant frequency signal with the transmitter local oscillator frequency signal to obtain the free induction decay difference frequency.

24. A method for locking to the resonant frequency of the nuclei in a sample under test for use in NMR spectroscopy comprising the steps of:
applying a fixed magnetic field to said nuclei;
exciting said nuclei with a variable frequency signal from a local oscillator to cause a resonant frequency to be generated by said nuclei in the presence of the fixed magnetic field, the resonant frequency being offset from the oscillator frequency;
combining the nuclei generated offset resonant frequency signal with the local oscillator signal to obtain a variable control frequency; and
utilizing said variable control frequency to adjust the local oscillator frequency to maintain the offset frequency and vary said nuclei excitation frequency with a change in the resonant frequency of the nuclei.

25. A method as in claim 24 further including the step of utilizing a single conversion superheterodyne receiver to compare the nuclei generated resonant frequency signal with the local oscillator signal to obtain said variable control frequency.

26. A device for use in NMR spectroscopy for locking to the resonant frequency of the nuclei of a test sample comprising:
means for applying a fixed magnetic field to said nuclei;
means for exciting said nuclei to resonate said nuclei and cause a resonant frequency signal to be generated by said nuclei;
a single conversion superheterodyne receiver coupled to said nuclei and said exciting means for receiving said resonant frequency signal and generating a control signal;
means for varying the magnetic field applied to said nuclei; and
means coupled between said single conversion superheterodyne receiver and said means for varying the magnetic field applied to nuclei for using said control signal to vary the magnetic field applied to said nuclei and obtain said lock.

27. A device as in claim 26 wherein said coupling means for using said control signal to vary the magnetic field further comprises:
serially coupled first and second wide band filters receiving and reducing the frequency of said control signal; and
means coupled to said second filter for converting said reduced frequency to current for varying said magnetic field.

28. A device as in claim 27 further comprising:
an oscillator forming part of said nuclei exciting means; and
a negative feedback loop coupled between the output of said first wide band filter and said oscillator to give greater accuracy in obtaining said lock and to cause the oscillator frequency to assume the frequency characteristics of the nuclei generated signal.

* * * * *